(12) United States Patent
Bosler et al.

(10) Patent No.: US 8,793,941 B2
(45) Date of Patent: Aug. 5, 2014

(54) PHOTOVOLTAIC ROOFING COMPONENTS AND SYSTEMS

(71) Applicants: Kenneth D. Bosler, Holland, PA (US); Husnu M. Kalkanoglu, Swarthmore, PA (US); Gregory F. Jacobs, Oreland, PA (US); Peter Chihlas, Lansdale, PA (US); Robert L. Jenkins, Honeybrook, PA (US); Sean X. Zhou, Collegeville, PA (US)

(72) Inventors: Kenneth D. Bosler, Holland, PA (US); Husnu M. Kalkanoglu, Swarthmore, PA (US); Gregory F. Jacobs, Oreland, PA (US); Peter Chihlas, Lansdale, PA (US); Robert L. Jenkins, Honeybrook, PA (US); Sean X. Zhou, Collegeville, PA (US)

(73) Assignee: CertainTeed Corporation, Valley Forge, PA (US)

( * ) Notice: Subject to any disclaimer, the term of this patent is extended or adjusted under 35 U.S.C. 154(b) by 0 days.

(21) Appl. No.: 13/675,568

(22) Filed: Nov. 13, 2012

(65) Prior Publication Data

US 2013/0118545 A1 May 16, 2013

Related U.S. Application Data

(60) Provisional application No. 61/559,593, filed on Nov. 14, 2011.

(51) Int. Cl.
  *E04D 13/18* (2014.01)
(52) U.S. Cl.
  USPC .................................. 52/173.3; 52/506.05
(58) Field of Classification Search
  USPC ............ 52/173.3, 393, 394, 395, 396.1, 402, 52/506.05
  See application file for complete search history.

(56) References Cited

U.S. PATENT DOCUMENTS

| | | | | |
|---|---|---|---|---|
| 3,199,258 A | * | 8/1965 | Jentoft et al. | 52/222 |
| 3,411,977 A | * | 11/1968 | Slater, Jr. | 428/33 |
| 4,067,155 A | * | 1/1978 | Ruff et al. | 52/105 |
| 4,965,976 A | * | 10/1990 | Riddle et al. | 52/396.05 |
| 5,155,952 A | * | 10/1992 | Herwegh et al. | 52/100 |
| 5,326,187 A | * | 7/1994 | St. Marie et al. | 403/402 |
| 5,611,185 A | * | 3/1997 | Wilz | 52/506.07 |
| 5,678,383 A | * | 10/1997 | Danielewicz | 52/775 |
| 6,318,047 B1 | * | 11/2001 | Richardson | 52/208 |
| 6,588,165 B1 | * | 7/2003 | Wright | 52/506.05 |
| 6,745,534 B2 | * | 6/2004 | Kornfalt | 52/468 |
| 8,056,602 B1 | * | 11/2011 | Green | 160/392 |
| 8,256,170 B2 | * | 9/2012 | Plaisted et al. | 52/173.3 |
| 8,327,595 B2 | * | 12/2012 | Stanchfield | 52/464 |
| 2005/0217193 A1 | * | 10/2005 | Kornfalt et al. | 52/395 |

* cited by examiner

*Primary Examiner* — Basil Katcheves
(74) *Attorney, Agent, or Firm* — McDonnell Boehnen Hulbert & Berghoff LLP

(57) ABSTRACT

The present invention relates particularly to photovoltaic roofing systems in which photovoltaic elements are integrated on a roof deck with conventional roofing materials. In one aspect, a photovoltaic roofing system includes a two-part tee element disposed on a roof deck, the two-part tee element comprising a base piece including a central portion; two opposed horizontally-extending first and second flanges extending from the central portion, and a top piece attachment feature formed in the central portion, and a top piece including a base piece attachment feature mated with the top piece attachment feature of the base piece; and a vertically extending portion extending from the base piece attachment feature. A first photovoltaic element can be disposed on the roof adjacent the base piece with its edge disposed on the horizontally-extending first flange of the base piece of the two-part tee element.

18 Claims, 16 Drawing Sheets

US 8,793,941 B2

PHOTOVOLTAIC ROOFING COMPONENTS AND SYSTEMS

CROSS-REFERENCE TO RELATED APPLICATIONS

This application claims the benefit of priority to U.S. Provisional Patent Application Ser. No. 61/559,593, filed Nov. 14, 2011, which is hereby incorporated by reference herein in its entirety.

BACKGROUND OF THE INVENTION

1. Field of the Invention

The present invention relates generally to photovoltaic systems. The present invention relates more particularly to photovoltaic roofing systems in which photovoltaic elements are integrated on a roof deck with conventional roofing materials.

2. Summary of the Related Art

The search for alternative sources of energy has been motivated by at least two factors. First, fossil fuels have become increasingly expensive due to increasing scarcity and unrest in areas rich in petroleum deposits. Second, there exists overwhelming concern about the effects of the combustion of fossil fuels on the environment due to factors such as air pollution (from $NO_x$, hydrocarbons and ozone) and global warming (from $CO_2$). In recent years, research and development attention has focused on harvesting energy from natural environmental sources such as wind, flowing water, and the sun. Of the three, the sun appears to be the most widely useful energy source across the continental United States; most locales get enough sunshine to make solar energy feasible.

Accordingly, there are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as device performance has improved. They can be used to provide at least a significant fraction of the electrical energy needed for a building's overall function; or they can be used to power one or more particular devices, such as exterior lighting systems.

Accordingly, research and development attention has turned toward the development of photovoltaic products that are adapted to be installed on a roof. While photovoltaic elements have been in use for some time, they tend to be heavy and bulky, and aesthetically unfavorable when installed on a roof. Roofing products having photovoltaic cells integrated with roofing products such as shingles, shakes or tiles have been proposed. A plurality of such photovoltaic roofing elements (i.e., including photovoltaic media integrated with a roofing product) can be installed together on a roof, and electrically interconnected to form a photovoltaic roofing system that provides both environmental protection and photovoltaic power generation. These can be very advantageous, but can be difficult to install on steep surfaces, and can often result in incomplete coverage of the roof surface with photovoltaic power generation. Moreover, fabrication and installation and connection of a plurality of smaller photovoltaic roofing elements can in some circumstances be a very slow, tedious, and costly process. There remains a need for improved devices and methods for the integration of photovoltaic media onto roof decks together with conventional roofing materials.

SUMMARY OF THE INVENTION

One aspect of the present invention is a photovoltaic roofing system for use on a roof deck, the photovoltaic roofing system comprising:

a two-part tee element disposed on a roof deck, the two-part tee element comprising:
  a base piece including a central portion; two opposed horizontally-extending first and second flanges extending from the central portion, and a top piece attachment feature formed in the central portion, and
  a top piece including a base piece attachment feature mated with the top piece attachment feature of the base piece; and a vertically extending portion extending from the base piece attachment feature; and
a first photovoltaic element disposed on the roof adjacent the base piece, the first photovoltaic element having its edge disposed on the horizontally-extending first flange of the base piece of the two-part tee element.

Another aspect of the invention is a method for installing a photovoltaic roofing system as described above on a roof, the method comprising:

affixing one or more base pieces to a roof;
disposing one or more photovoltaic elements on the roof, each adjacent a base pieces, such that horizontal edges of the photovoltaic elements are each disposed on a flange of a base piece; and
assembling a top piece with each base piece to form the two-part tee elements.

The photovoltaic roofing components and systems of the present invention can result in a number of advantages over prior art photovoltaic systems. In certain aspects, the present invention addresses the problem of framing of roofing integrated photovoltaic systems on a roof. For example, in one embodiment, the present invention provides plastic or polymeric parts, which are non-conductive and do not require electrical grounding when they are a part of a photovoltaic system. Moreover, corrosion can be avoided by the use of plastic or polymeric parts. In certain embodiments, the present invention provides a two-part "tee" or framing piece, which can allow for easy replacement of damaged parts, and can allow for changes in shape and color as desired to adapt the visual aspect of the array. In certain embodiments, a flange can be included to assist in holding down a photovoltaic element onto a roof surface. A two-part configuration also allows the selective use of more costly weather-durable materials in the parts of the framing that are exposed to the elements (e.g., the top pieces). Further, in certain embodiments a common base piece can be used for both tee pieces and side framing pieces, with different components being fitted with differing top pieces (e.g., at the time of installation). Other advantages will become apparent to the person of skill in the art in view of the present disclosure.

The accompanying drawings are not necessarily to scale, and sizes of various elements may be distorted for clarity.

DETAILED DESCRIPTION OF THE INVENTION

Figure 1:
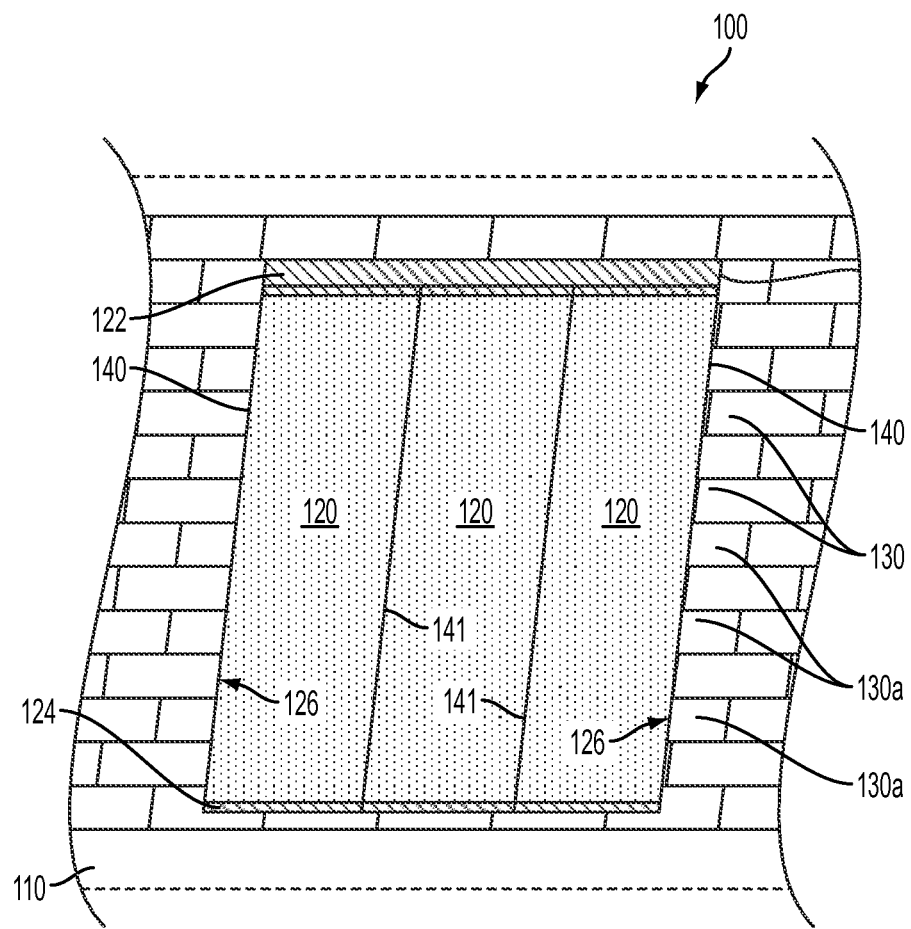
FIG. 1 is a schematic top perspective view of a photovoltaic roofing system on a roof.

In one aspect, the present invention provides a two-part tee element (i.e., usable as a framing piece) for a roofing integrated photovoltaic system. The two-part tee element includes a base piece (e.g., in strip form); and a top piece (e.g., in strip form). In one aspect, a base piece includes two opposed horizontally-extending first and second flanges extending from a central portion. A first photovoltaic element can be disposed on the roof adjacent to the base piece, with its edge disposed on the horizontally-extending first flange. Desirably, the photovoltaic element overlaps the first flange by at least about one inch. A second photovoltaic element or a roofing element can be disposed on the roof adjacent the base piece opposite the first photovoltaic element, with its edge disposed on the horizontally-extending second flange. Desirably, the second photovoltaic element or the roofing element overlaps the second flange by at least about one inch. A top piece attachment feature (e.g., a receiver channel) is provided in the central portion of the base piece. The two-part tee element also includes a top piece, which includes a base piece attachment feature configured to mate with the top piece attachment feature of the base piece; and a vertically extending portion extending from the base piece attachment feature. For example, the top piece can include a vertical leg that is inserted into a receiver channel in the base piece. When installed, the top piece can delineate regions separating photovoltaic elements one from another and/or from fields of conventional roofing materials mounted on a roof.

In certain embodiments, covering flanges extend outwardly from the sides of the top piece that can overlap the top surface of an adjacent photovoltaic element or roofing element. For example, in one embodiment, the top piece further includes a first covering flange extending outwardly from a side of the top piece, and overlapping the top surface of the first photovoltaic roofing element, the second photovoltaic element, or a roofing element. In certain such embodiments, a second covering flange extends outwardly from the opposite side of the top piece, and overlaps the top surface of the first photovoltaic element, the second photovoltaic element, or a roofing element.

In one embodiment of the invention, a base piece has a receiver channel and side flanges. Fasteners are applied through the base piece within the receiver channel for attachment to a roof. A photovoltaic element is attached to the roof adjacent to the base piece, at least partially covering one of the side flanges. The receiver channel provided in the base piece is configured to accept a mating structure from a top piece. As described above, the top piece can to delineate regions separating photovoltaic elements one from another and/or from fields of conventional roofing materials mounted on the roof. In certain embodiments, a covering flange extends outwardly and downwardly from the top piece and can engage the top surface of the adjacent photovoltaic element.

The top piece can include a variety of physical structures or shapes. In certain embodiments, it provides a vertically-extending strip to delineate portions of the photovoltaic array. Shadows cast by the vertical strip can visually break up the field of blue (or other color of the photovoltaic materials) to make the system appear more consistent with other roofing materials.

In another embodiment, one or more covering flanges can extend from the top piece (e.g., a vertically-extending portion thereof) to engage a photovoltaic element disposed on a horizontally-extending flange of the base piece. This engagement can assist in mechanically affixing the photovoltaic element to the roof surface as a supplement to an adhesive or other attachment system. The covering flange can prevent edge uplift of the photovoltaic element from the roof deck. They can also reduce the possibility of moisture, dirt, insects, leaves, ice & snow, or other matter intruding under the photovoltaic element that could lead to disbondment from the surface.

In another embodiment, a covering flange can cover and flash in the edge of a shingle field adjacent the photovoltaic elements on the roof.

Another aspect of the invention is a method for installing a photovoltaic roofing system on a roof. The method includes affixing one or more base pieces (as described herein) to a roof deck. The person of skill in the art can provide sufficient spacing between base pieces to allow photovoltaic elements to fit between the top piece attachment features (e.g., receiver channels). One or more photovoltaic elements are then disposed on the roof, each adjacent a base piece, such that horizontal edges of the photovoltaic elements are each disposed on a flange of a base piece. After disposal of the photovoltaic elements, top pieces are assembled with the base pieces to form two-part tee elements. In certain embodiments, each top piece includes a flange extending outwardly therefrom, covering an edge of a photovoltaic element disposed on a flange of the base piece.

In certain embodiments of the methods described herein, one or more of the base pieces is disposed at a side edge of the field of the array of photovoltaic elements, near a field of roofing material. The top piece that is attached to (e.g., inserted into the channel of) the side edge base piece has a flange extending outwardly from the direction of the photovoltaic array, which provides a flashing aspect to merge the photovoltaic roofing system with the field of roofing material (e.g., shingles).

Having two-part tees and other framing pieces has an advantage in installation of photovoltaic roofing systems. The lower profile of the base piece with the top piece attachment feature (e.g., receiver channel) provides assistance and acts as a guide in placement and alignment of photovoltaic elements on the roof, and does not protrude very high from the roof surface. This helps in avoiding damage to framing pieces while installation is in progress and avoids workers tripping over the framing pieces, potentially damaging the frame pieces or the photovoltaic element. Installation of the top piece provides a finished look to the system, and in certain embodiments can provide the interfaces between materials with additional protection from ingress of water.

A photovoltaic roofing system is shown in schematic top perspective view in FIG. 1. Photovoltaic roofing system 100 includes a roof deck 110, upon which one or more (in this case, three) photovoltaic elements 120 are disposed. The one or more photovoltaic elements (together) have a top edge 122 facing the upper end of the roof deck; a bottom edge 124 facing the lower end of the roof deck, and two side edges 126. The photovoltaic roofing system also includes a plurality of roofing elements 130 disposed outside the photovoltaic area, along their side edges 126. In this embodiment, the roofing elements are granule-coated bituminous shingles. Of course, other types of roofing elements can be used with the photovoltaic roofing system. In order to provide a desired overlap pattern of the roofing elements, it may be necessary to cut certain of the roofing elements (e.g., roofing elements 130a) or otherwise provide roofing elements of different widths. Photovoltaic roofing system 100 also includes linearly-extending side flashing two-piece tee elements 140 disposed along the side edges of the contiguously-disposed photovoltaic elements and linearly-extending batten two-piece tee elements 141 disposed between the photovoltaic elements. Similar roofing systems are described in more detail in U.S. Patent Application Publications nos. 2010/0242381 and U.S. patent application Ser. No. 13/243,726, each of which is hereby incorporated herein by reference in its entirety. As the person of skill in the art will appreciate in view of the present disclosure, the two-piece tee elements described herein can be used as any of the side flashing or tee elements described in the above-referenced applications (e.g., as items 140 and 141 in FIG. 1). The present disclosure specifically contemplates each embodiment described in the above-referenced applications, with any of the two-piece tee elements described herein used as any side flashing (separating photovoltaic elements from roofing elements) or tee elements (separating adjacent photovoltaic elements) configured therein.

Figure 2A:
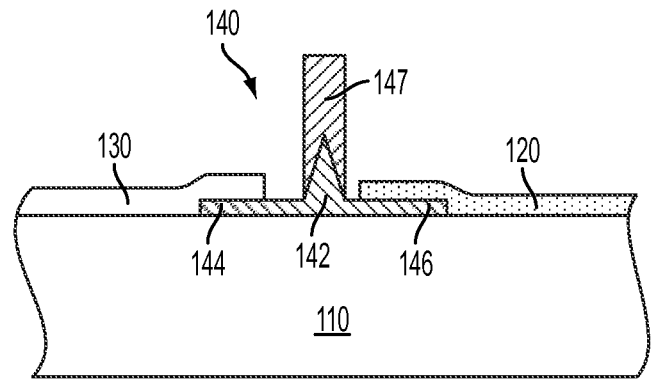
FIG. 2A is a partial cross-sectional schematic view of the side flashing of the embodiment of FIG. 1.

The side flashing two-piece tee element of the embodiment of FIG. 1 is shown in more detail in the partial schematic cross-sectional view of FIG. 2A. The side flashing two-piece tee element 140 has a cross-sectional shape including a base piece 142 having flanges 144, 146 extending therefrom. The base piece 142 also includes a top piece attachment feature (the upwardly-pointing triangular feature). The side flashing two-piece tee element 140 also includes a top piece 147, which extends vertically from the base piece, and includes a base piece attachment feature (here, a triangular channel) which mates with top piece attachment feature of the base piece. The flange 146 facing the contiguously-disposed photovoltaic elements is at least partially disposed between the photovoltaic element 120 and roof deck 110. The flange 144 facing away from the contiguously-disposed photovoltaic elements is at least partially disposed between the roofing element 130 and roof deck 110. The side flashing two-piece tee element can thereby provide a water resistant seam between the contiguously-disposed photovoltaic elements and the roofing elements. Linearly extending two-piece tee elements 141 are similar in construction and similarly installed (not shown), but have the flanges 144 and 146 are each at least partially disposed between photovoltaic elements 120 and the roof deck 110.

The photovoltaic roofing systems described herein can provide a number of advantages over conventional photovoltaic installations. For example, when using traditional photovoltaic panels, bolts must be driven through the roof (and through the roofing elements protecting the roof) in order to hold the panels in place, which can create the potential for leakage. In many cases, the bolts must be driven through the framing members of the roof, in order to provide sufficient anchoring for the relatively heavy photovoltaic panels. In certain embodiments of the present photovoltaic roofing system, there is no need for bolts through the roof, or through any roofing elements. Fasteners are often used to hold the two-piece tee elements in place, but such fasteners can be covered by the roofing elements and photovoltaic elements disposed on the flashing. Alternatively, two-piece tee elements can be fastened using fasteners that go through a central portion of a base piece that is covered by a top piece of the two-piece tee element. Accordingly, in one embodiment of the invention, all fasteners holding the components of the photovoltaic roofing system in place are covered by roofing elements or photovoltaic elements, or by a top piece of a two-piece tee element. Moreover, roof penetrations for electrical connections can be minimized with respect to conventional systems.

Figure 2B:
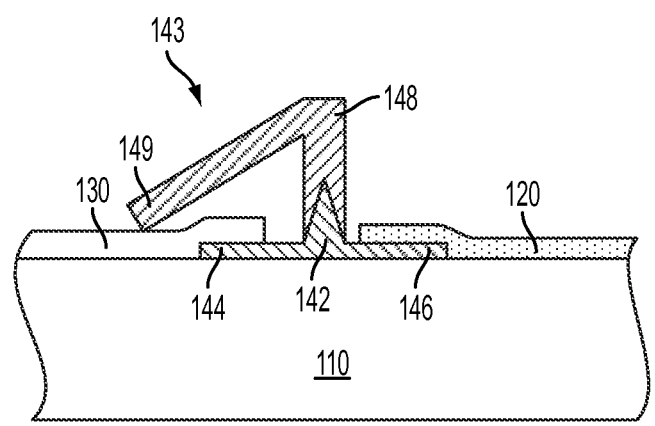
FIG. 2B is a partial cross-sectional view of another embodiment of a side flashing.

An alternative side flashing two-piece tee element 143 is shown in FIG. 2B. The side flashing two-piece tee element 143 has a cross-sectional shape including a base piece 142 as described above with reference to FIG. 2A. The side flashing two-piece tee element 143 also include a top piece 148, which extends vertically from the base piece. The top piece 148 is generally as described above with respect to FIG. 2A, but also includes a sidewardly directed flange 149 extending from its vertically-extending feature (here, at the top). The flange 146 facing the contiguously-disposed photovoltaic elements is at least partially disposed between the photovoltaic element 120 and roof deck 110. The flange 144 facing away from the contiguously-disposed photovoltaic elements is at least partially disposed between the roofing element 130 and roof deck 110. The flange sidewardly directed flange 149 extends to cover at least a portion of the edge of the roofing element 130. The side flashing can thereby provide a water resistant seam between the contiguously-disposed photovoltaic elements and the roofing elements. Sidewardly directed flanges can similarly be used to cover the interface of a photovoltaic element with a base piece flange.

Figure 3A:
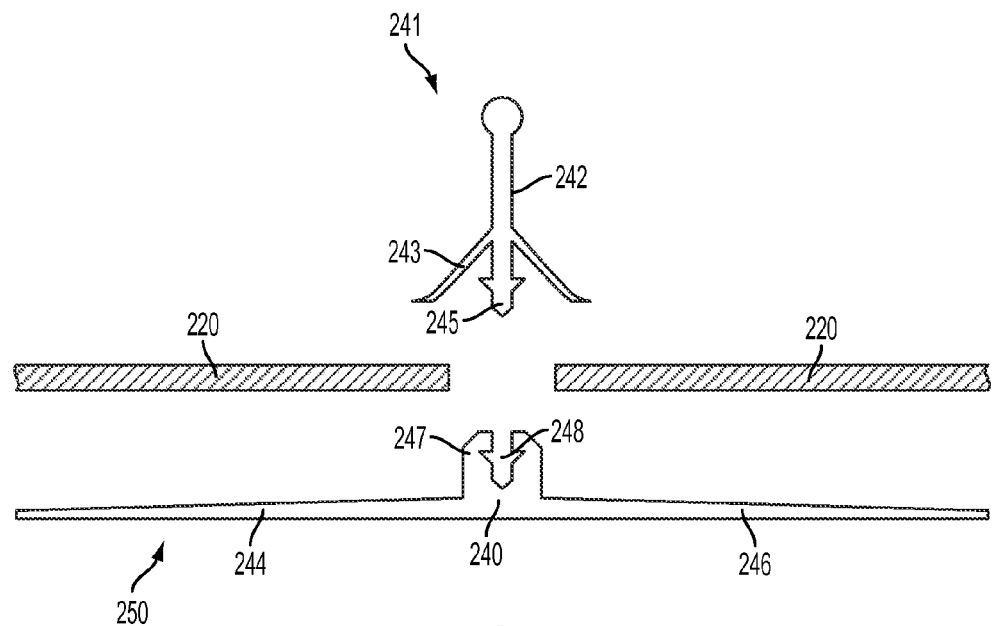
FIG. 3A is an exploded cross-sectional schematic view of components of a photovoltaic element including a two-part tee element and two photovoltaic elements.
Figure 3B:
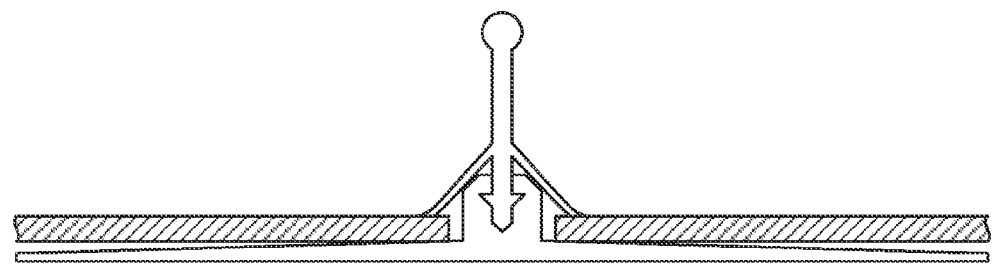
FIG. 3B is a cross-sectional schematic view of the components of FIG. 3A, as assembled in a photovoltaic system.
Figure 4A:
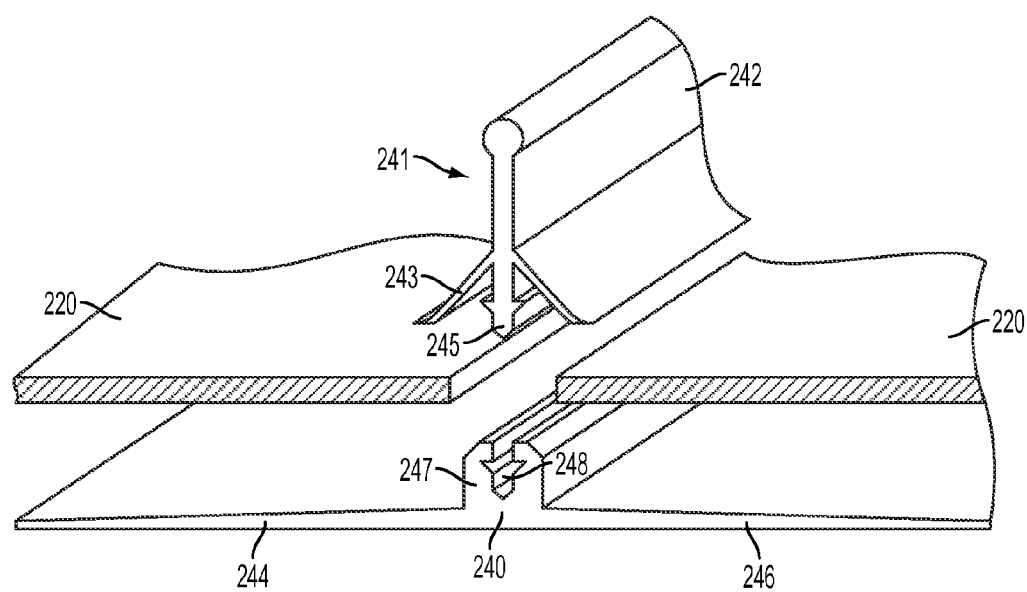
FIG. 4A is a perspective schematic view of the components of FIG. 3A.
Figure 4B:
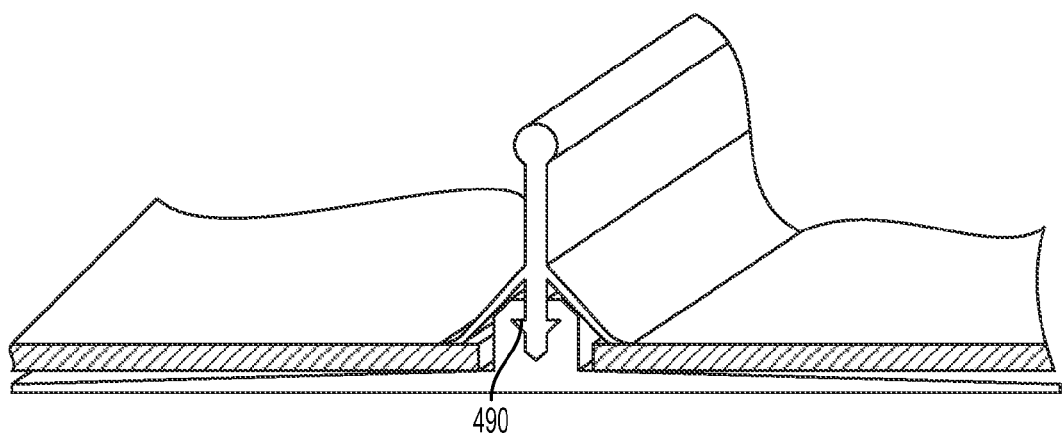
FIG. 4B is a perspective schematic view of the assembly of FIG. 3B.

FIGS. 3A, 3B, 4A and 4B show another embodiment of the two-part tee of the invention having a top piece 241 with an upwardly extending portion 242; and a base piece 240. The base piece 240 has a receiver portion 247 with a receiver 248 to receive a snap-fitting bayonet 245 from top piece 241. The top piece has side flanges 243 that extend to cover the edges of photovoltaic elements 220 when assembled on a roof 250. In one embodiment, the top piece is slidably engaged with the base piece. In another embodiment, the cap piece is rigidly held by the base piece. In FIGS. 3B and 4B, the photovoltaic elements are rigid, and do not follow the slope of the flanges of the base piece. In other embodiments, the photovoltaic elements can follow the slope of the flanges (e.g., they are flexible; or have a downward-facing surface adapted to receive the sloped flange).

Figure 5A:
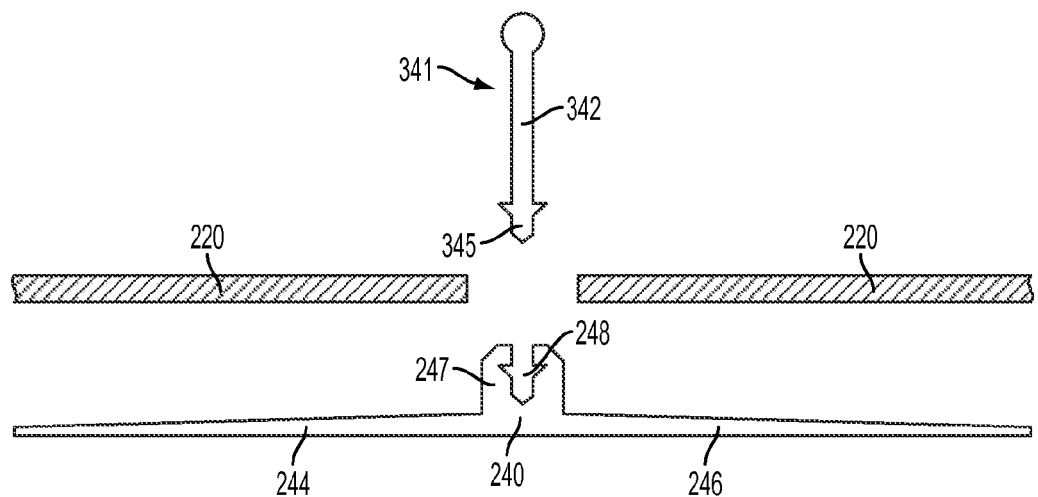
FIG. 5A is an exploded cross-sectional schematic view.
Figure 5B:
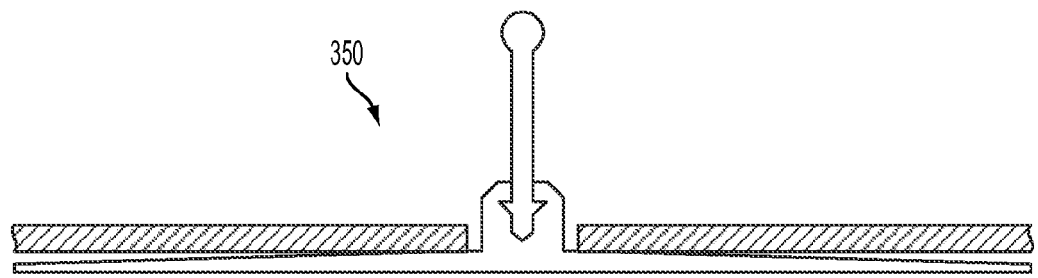
FIG. 5B is a cross-sectional schematic view of a photovoltaic roofing system using a different two-part tee element, according to another embodiment of the invention.

FIGS. 5A and 5B show a two-part tee element having an alternative top piece 341 having an upwardly extending portion 342 and a bayonet-like fastener 345 for attachment to base piece 240. In this embodiment the upwardly extending portion does not include side flanges to cover the edges of photovoltaic elements 220 when assembled (as shown in FIG. 5B).

Figure 6:
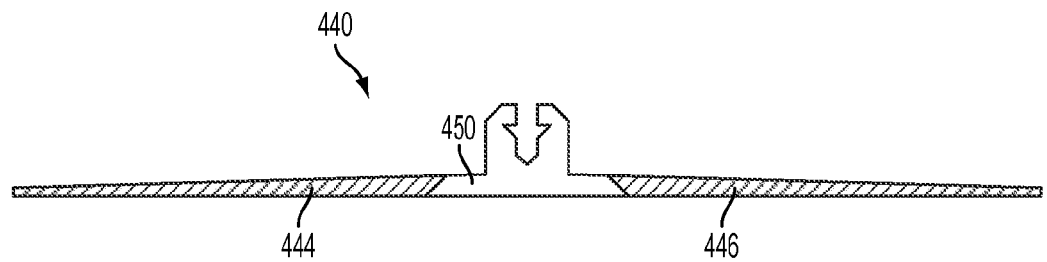
FIG. 6 is a cross-sectional schematic view of a base piece comprising a plurality of materials.

In FIG. 6, a base piece 440 is made up of at least two different materials, the central portion 450 having a different composition than the side flanges 444 and 446. In one aspect the central portion 450 that is partially exposed to the environment when the base piece is installed on the roof is comprised of more weatherable durable polymeric materials than the flanges 444, 446 that are not exposed. In another aspect, for embodiments in which the base piece is attached to the roof with fasteners through the side flanges 444 and 446, the flanges can be constructed of a material that is softer and readily receptive to nail application to a roof deck.

Figure 7:
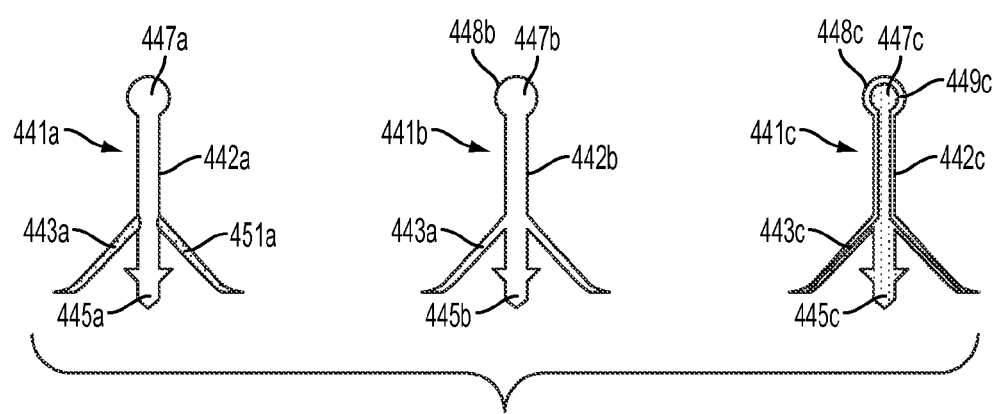
FIG. 7 is a cross-sectional schematic view of three embodiments of top pieces of tee elements, each comprising a plurality of materials.

In certain embodiments, the top piece of the two-part tee is formed from a different material than the base piece. Because the two-part tee has a top piece that is exposed and a base piece that is not exposed in use, a more weather resistant material can be used for the top piece and less costly materials can make up the base. Three different top piece embodiments are shown in schematic cross-sectional view in FIG. 7. Top piece 441a has a vertically extending portion 442a and a fastening portion 445a (i.e., to act as a base piece attachment feature). A first material 447a is used in the upwardly extending portion and fastening part of the body of the top piece. The side flanges 443a are made of a material of a different composition 451a. In one embodiment, materials 447a and 451a are coextruded to shape the top piece 441a. In an alternative embodiment, side flanges 443a are inserted into the structure of the top piece 441a to yield a top piece having side flanges differing in composition from the central body of the piece. In one aspect such a configuration can be useful to provide rubbery or flexible side flanges for sealing against the top surface of photovoltaic elements when installed on a roof. In another aspect, the side flanges can be stiffer than the main body of the top piece to help hold the edges of a photovoltaic element in place.

Top piece 441b has a vertically extending portion 442b and a fastening portion 445b (i.e., to act as a base piece attachment feature). A first material 447b is used in the core of the upwardly extending portion and fastening part of the body of the top piece. The vertically extending portion 442b and the side flanges 443b are covered by a capstock of a material of a different composition 448b. In one embodiment, materials 447b and 448b are coextruded to shape the top piece 441b. The coextrusion provides a weatherable cap on the exposed portions of the top piece. The core can be formulated for economic advantage without as great a need to account for weatherability concerns, and be formulated to economic advantage in tailoring physical and mechanical properties for the bulk of the top piece.

Top piece 441c has a vertically extending portion 442c and a fastening portion 445c (i.e., to act as a base piece attachment feature). A first material 447c is used in the core of the upwardly extending portion and fastening part of the body of the top piece. The vertically extending portion 442c and the side flanges 443c are covered by a capstock of a material of a different composition 448c. A third composition 449c is interposed between the core material 447c and the capstock 448c. In one embodiment, materials 447c, 448c and 449c are coextruded to shape the top piece 441c. Coextrusion provides a weatherable cap on the exposed portions of the top piece. In one aspect the capstock 448c is at least partially transparent in the near infrared and the inner layer 449c is reflective of infrared radiation. The core can be formulated for economic advantage without as great a need to account for weatherability concerns, and be formulated to economic advantage in tailoring physical and mechanical properties for the bulk of the top piece. Thus, in one embodiment the top piece is solar reflective and presents a desirable colored visual aspect to a viewer. The solar reflective aspect enables the part to have less heat buildup on a roof and reduced tendency for heat distortion or other dimensional changes in use.

Figure 8:
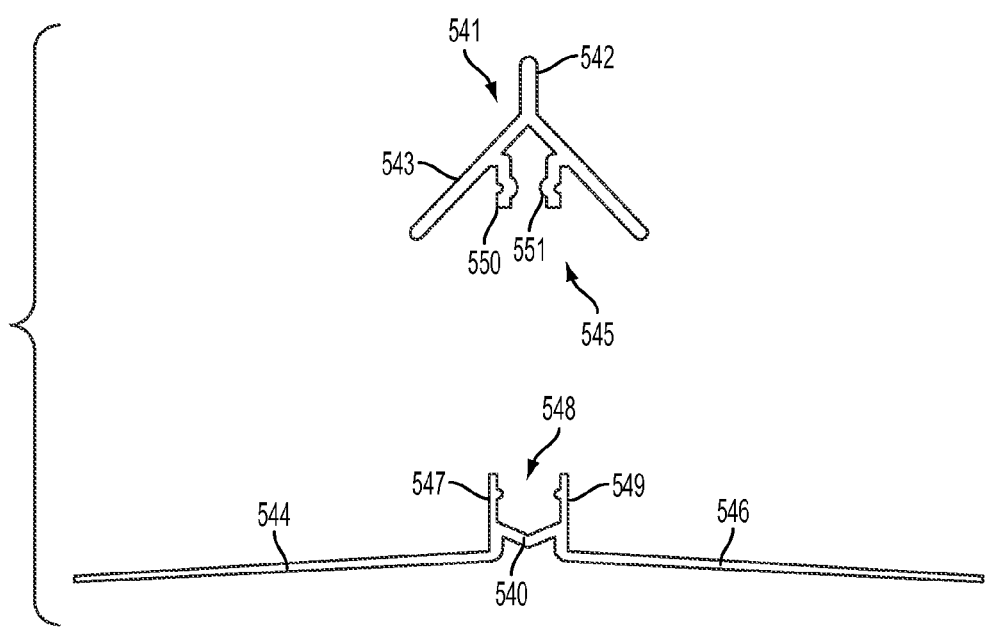
FIG. 8 is an exploded cross-sectional schematic view of a two-part tee element according to one embodiment of the invention.

FIG. 8 is a cross-sectional view of another two-part tee element having a top piece 541 and a base piece 540. The top piece has a vertically extending portion 542, side flanges 543, and a downwardly directed portion 545 for engaging with the base piece (i.e., to serve as a base piece attachment feature). The downwardly directed portion 545 has two legs 550 and detent features 551 that engage with corresponding detent features 549 in the opening 548 of the top piece attachment feature 547 of the base. The base piece also has two side flanges 544 and 546. In this embodiment, the parts have a thinner and more uniform thickness for a profile extrusion with easier polymer flow and cooling with less potential for distortion and warpage of parts. In this embodiment, the height of the top piece from the bottom of the attachment legs to the top of the upwardly extending portion is about 1 inch. The upward extension has a thickness of about ⅛ inch. The side flanges for the top piece extend to cover a width of about 1½ inches.

Figure 9A:
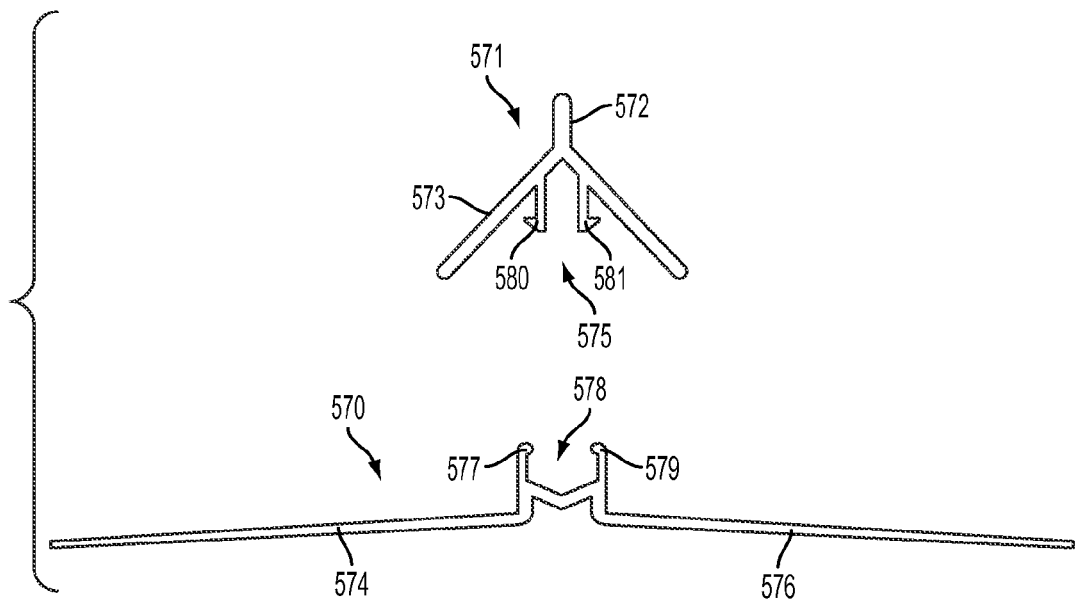
FIG. 9A is an exploded cross-sectional schematic view.
Figure 9B:
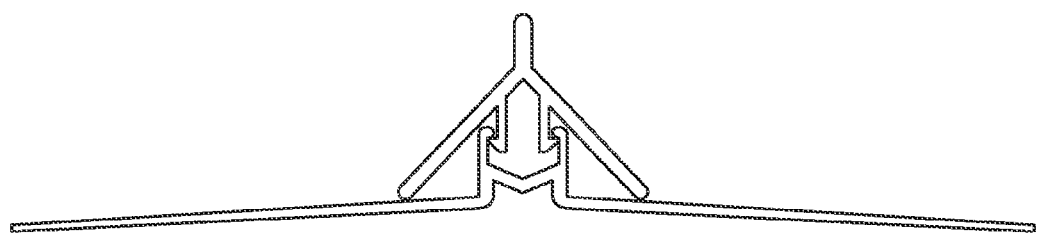
FIG. 9B is an assembled cross-sectional view of a two-part tee element. according to another embodiment of the invention.

FIG. 9A is a cross-sectional schematic view of another two-part tee element having a top piece 571 and a base piece 570, the assembled parts being shown in cross-sectional schematic view in FIG. 9B. The top piece has a vertically extended portion 572, side flanges 573, and a downwardly directed portion 575 that serves as a base piece attachment feature. The downwardly directed portion 575 has two legs 580 and detent features 581 that engage with corresponding detent features 579 in the opening 578 of the top piece attachment feature 577 of the base piece. The base piece also has two side flanges 574 and 576. In the embodiment of FIGS. 9A and 9B, the height of the top piece from the bottom of the attachment legs to the top of the upwardly extending portion is about 1.2 inches. The upward extension has a thickness of about ⅛ inch. The side flanges for the top piece extend to cover a width of about 1.58 inches. The thickness of the side flanges 573 is about 0.080 inch, as is the thickness of the wall of the receiver 577. The width at the prongs of the detent feature 581 is about 0.437 inch such that the legs 580 flex to provide a retaining force when assembled into the receiving channel 578 which has a width of about 0.42 inch.

Figure 10A:
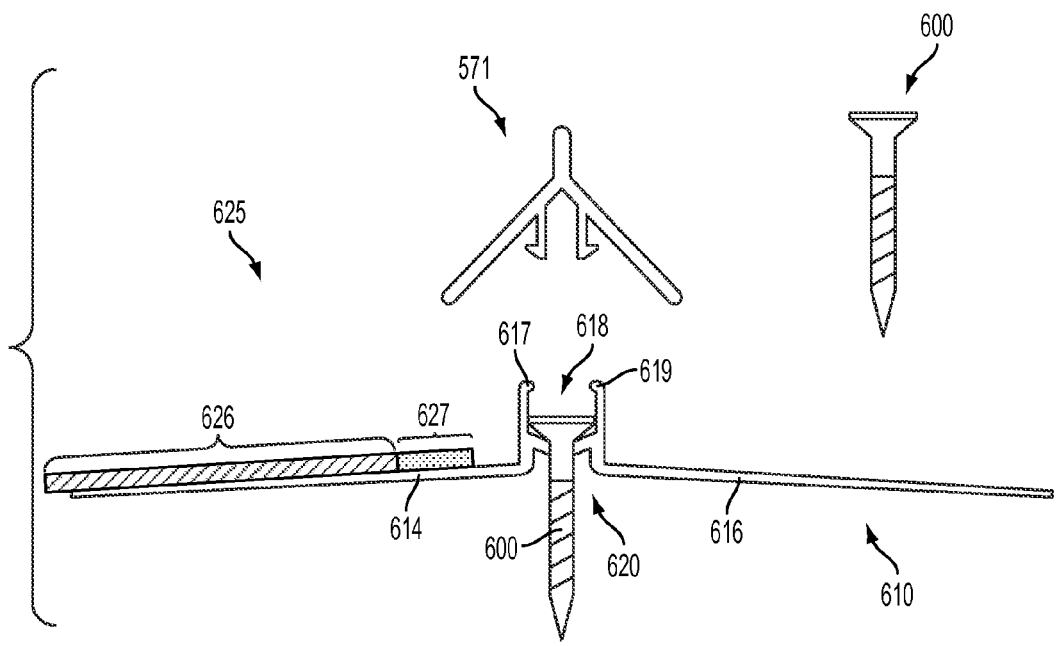
FIG. 10A is an exploded cross-sectional schematic view.
Figure 10B:
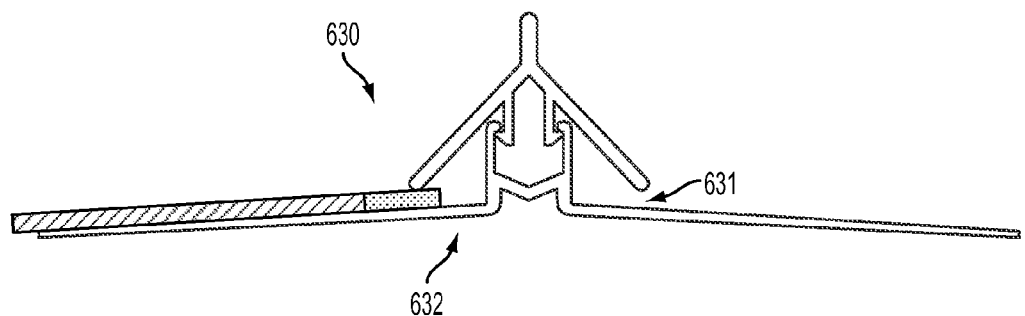
FIG. 10B is an assembled cross-sectional view of a two-part tee element and a fastener. according to another embodiment of the invention.

FIGS. 10A and 10B are cross-sectional schematic views of a two-part tee element similar to that of FIG. 9A, with a photovoltaic element 625 and a fastener 600, and an assembly thereof. In this case, the top piece 571 is the same as that in FIG. 9A, but the base piece 610 has a more flattened bottom (indicated by reference numeral 620) in the region of the receiving channel 618 where the fastener 600 penetrates the base to attach it to a roof deck. The base piece has side flanges 614 and 616 and the receiver portion 617 includes a detent feature 619 to engage with the top piece 571. A photovoltaic element 625 is disposed on the flange 614 on the left side of the receiver of the base piece. The photovoltaic element 625 has an active area 626 and a non-active area 627 near the edge of the module. When the top piece 571 is engaged with base piece 610 as in the assembly 630, the side flanges 573 engage the non-active portion of the photovoltaic element and do not encroach on the active area thereof. As a photovoltaic element is not present on the right side of base piece 610, a gap 631 is shown to represent the space to accommodate a module. A distance 632 is provided between the edge of the module 625 and the receiver portion 617 on the base piece to accommodate thermal expansion and contraction of the parts in use.

Figure 11:
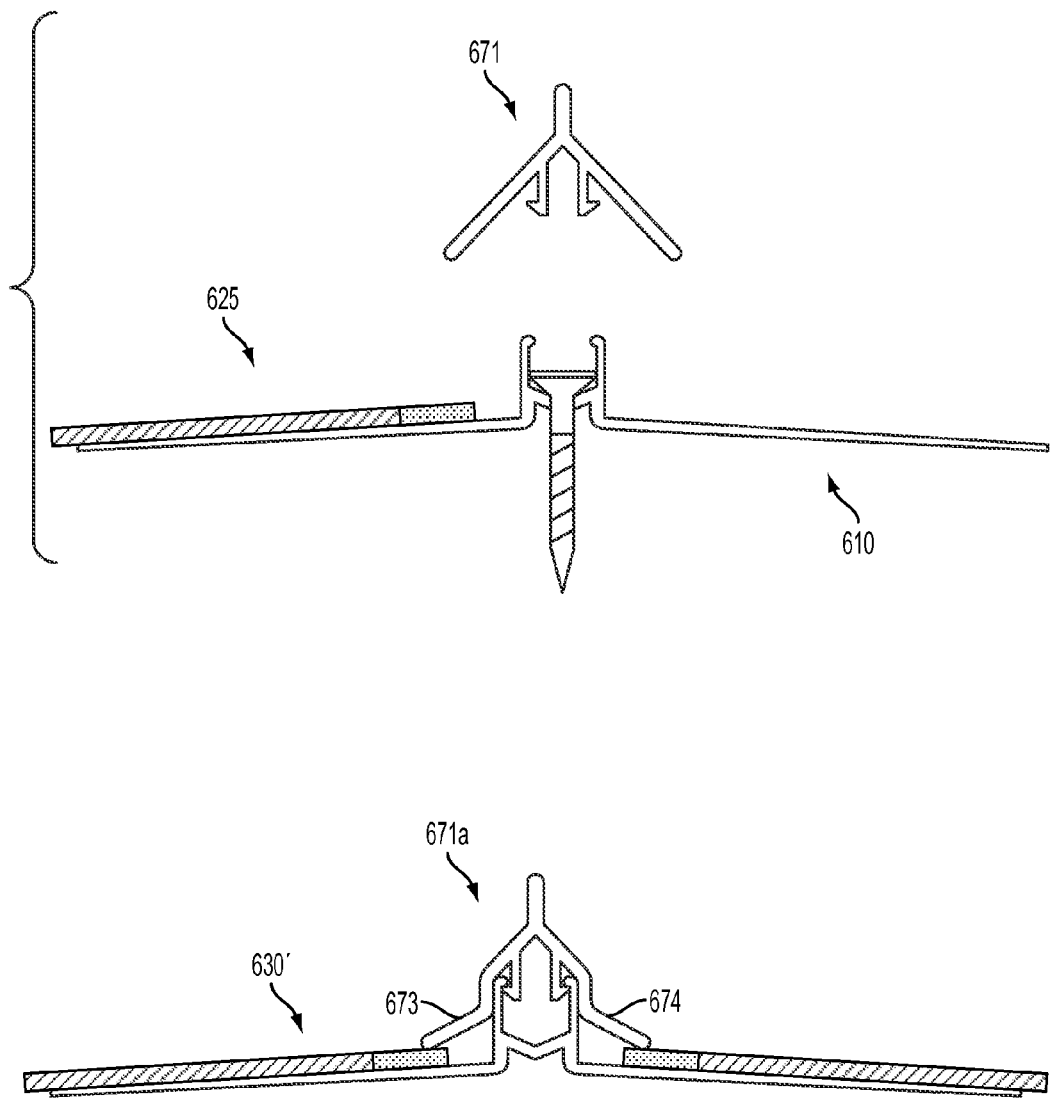
FIGS. 11, 12, and 13 are cross-sectional views of other two-part tee elements and assemblies according to other embodiments of the invention.
Figure 12:
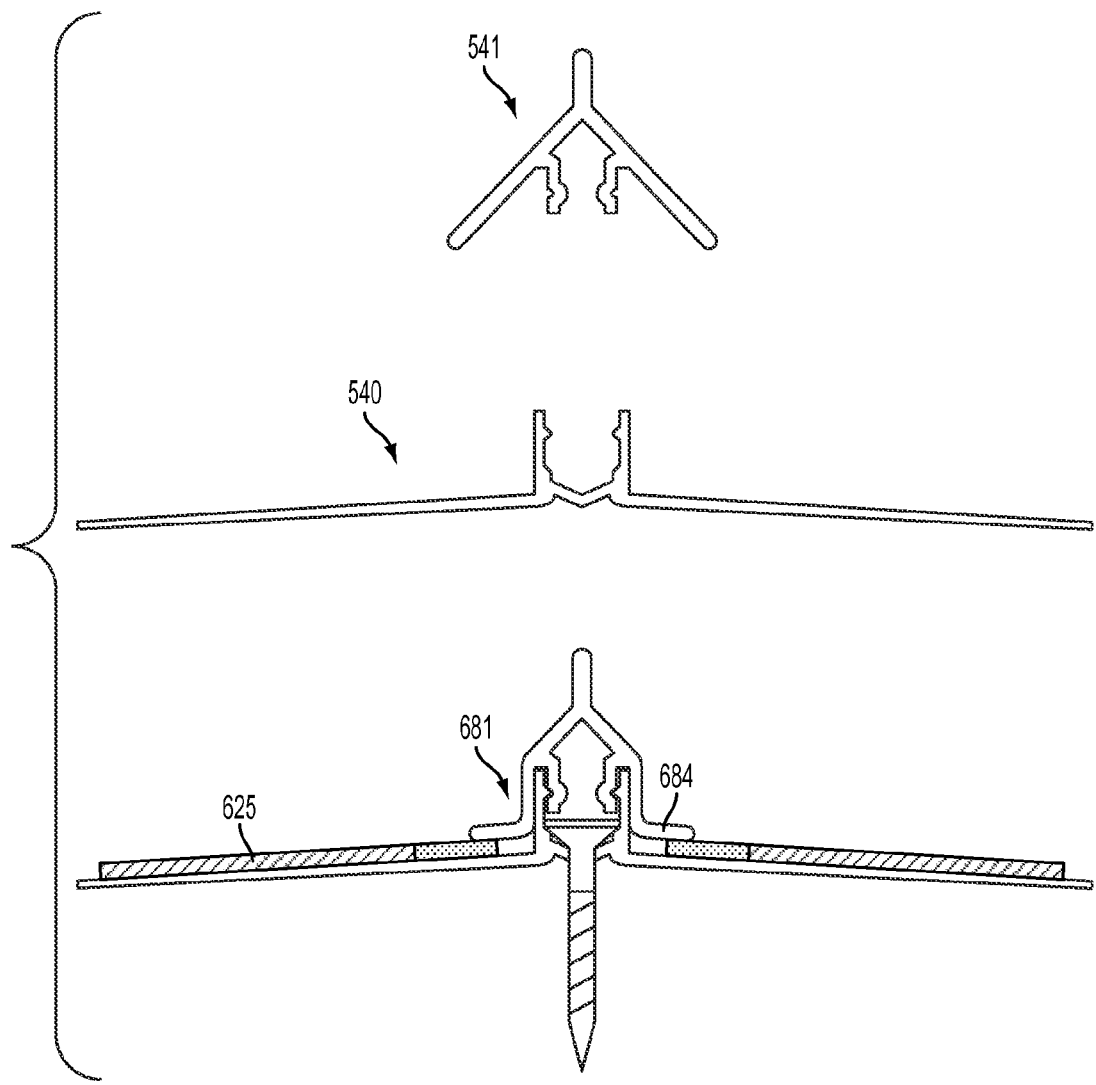
Figure 13:
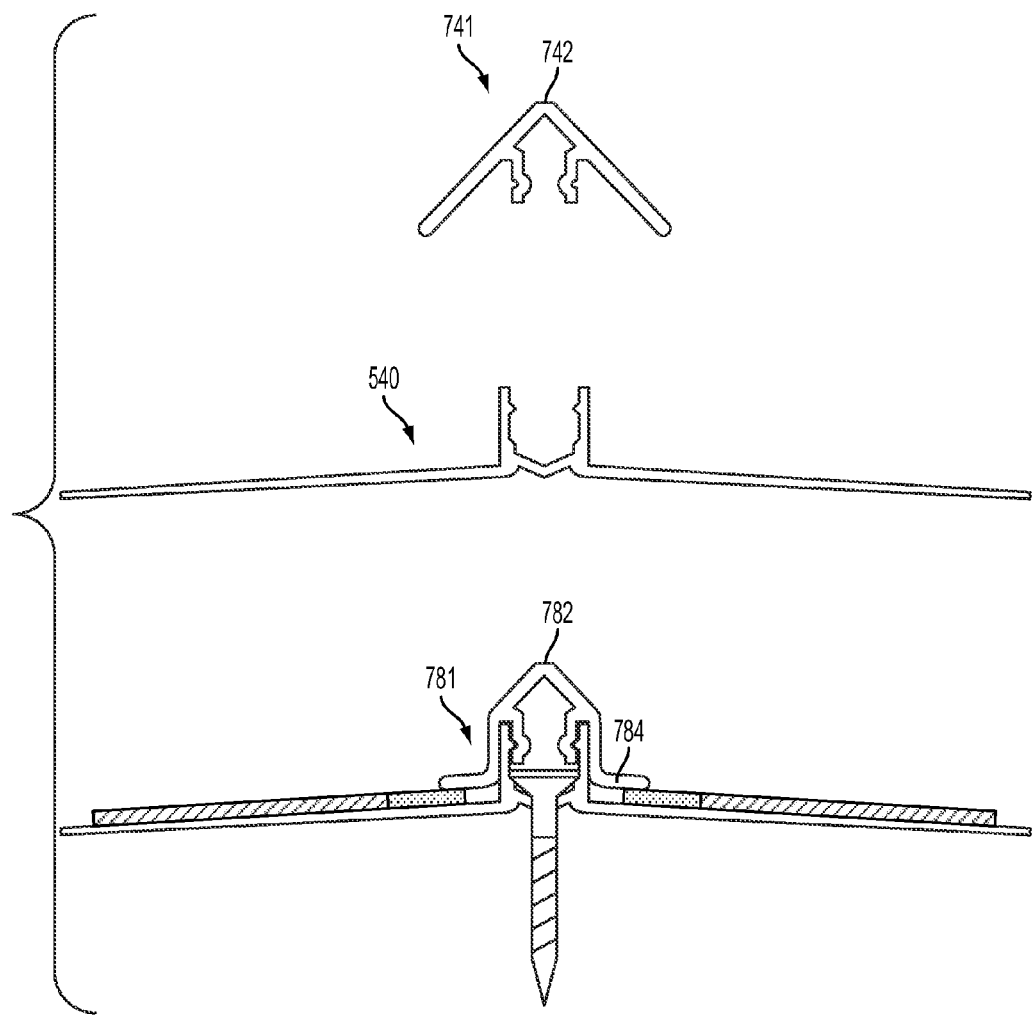

FIGS. 11, 12, and 13 are cross-sectional schematic views of other two-part tee elements and assemblies. In FIG. 11, the top piece 671 has deformable side flanges so that in the assembled state, top piece 671a has a side flange 673 reshaped to conform to and accommodate the photovoltaic element and engage it with a tension to participate in maintaining it in position. An alternate shape side flange 674 is also shown. The top piece 541 and base piece 540 of FIG. 12 are similar to those of FIG. 8, but the top piece is deformed to take on another shape 681 with shaped flanges 684 to engage the photovoltaic element 625. The top piece 741 in FIG. 13 has an alternative shape with a minimal upwardly extending portion 742. As shown here, it is configured to engage with base piece 540. Alternatively, side flanges 784 of top piece 781 are shaped to engage the photovoltaic element in a non-active area. The top piece 741,781 has a lower profile with less potential to shadow active areas of photovoltaic material at grazing illumination angles, yet still shows a delineation of roof texture between adjacent photovoltaic elements.

Figure 14:
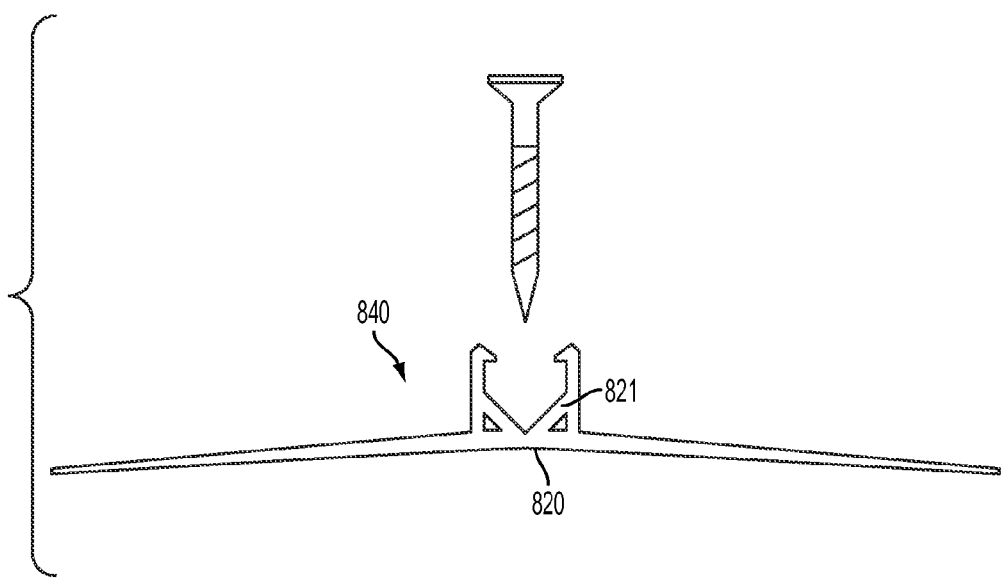
FIG. 14 is a cross-sectional view of a base piece of a two-part tee element according to another embodiment of the invention.

FIG. 14 is a cross-sectional view of an alternative base piece 840 having a flat bottom in the fastening zone 820 and an angled rib structure 821 to provide an angled surface to mate with the beveled shape of a fastener such as a screw head.

Figure 15:
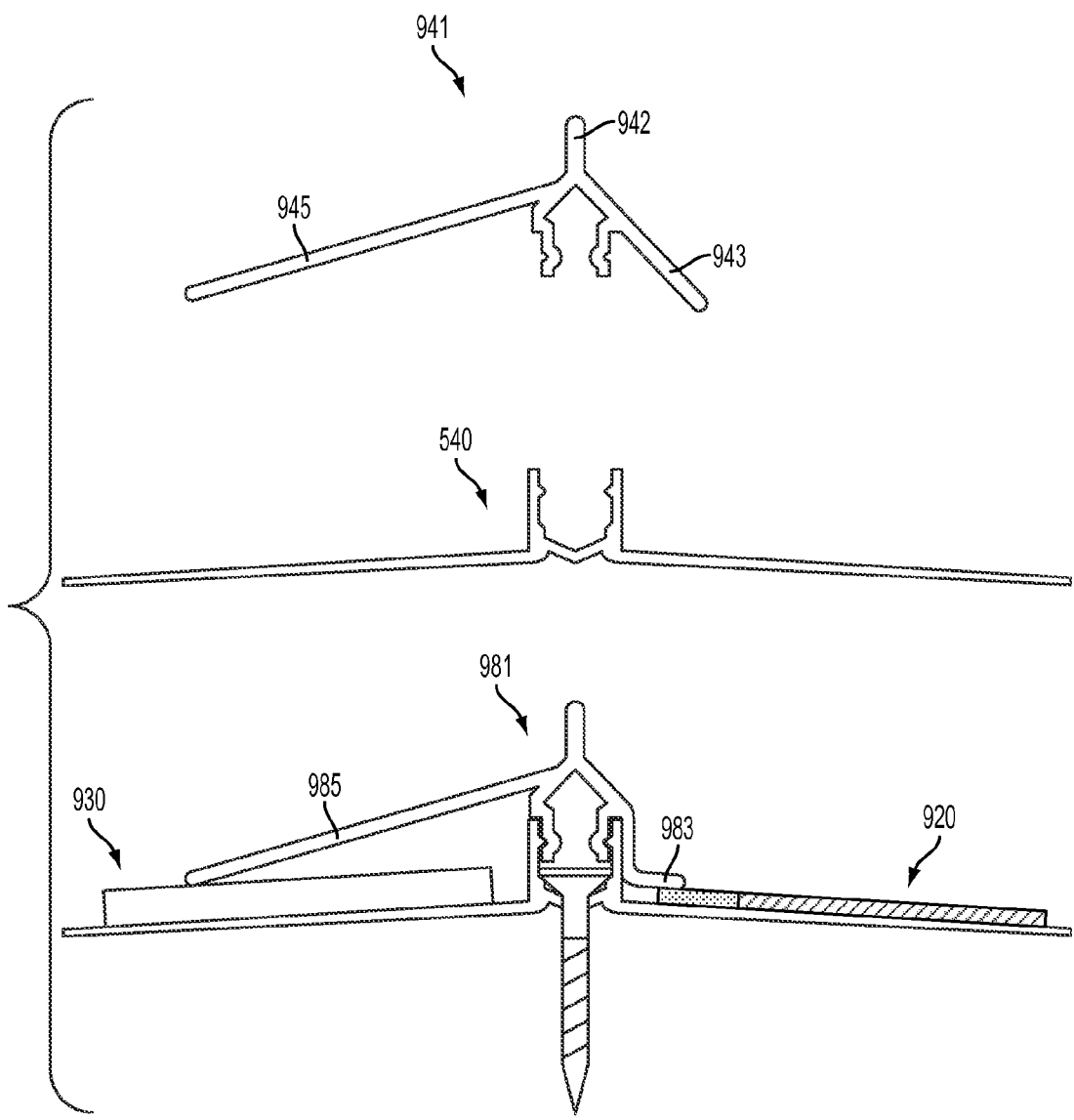
FIG. 15 is a cross-sectional view of a two-part tee element used suitable for use as a side flashing element and an assembly thereof including a roofing material and a photovoltaic element, according to one embodiment of the invention.

FIG. 15 is a cross-sectional schematic view of a two-part side flashing element and an assembly thereof including a roofing material and a photovoltaic element. In this case, top piece 941 has a vertically extending portion 942, a side flange 943, and an extended side flashing flange 945. The top piece engages with base piece 540 at the left side of a photovoltaic array. When assembled, the side flashing flange 945 extends over the top surface of shingle 930 or other roofing material adjacent the photovoltaic array. The shorter side flange engages the non-active area of the end photovoltaic element. In FIG. 15, flashing top piece 981 has a flashing 985 covering the edge of the shingle 930 to close the roof and the shorter flange 983 engaging the non-active area 922 of photovoltaic element 920. It will be understood that a flashing for a left edge of a photovoltaic roofing system can be reversed in orientation to yield a right edge flashing piece. In the case of this invention, the same base piece can be used for either the left or right edge side flashing, as well as for the battens or tee pieces for the interior portions of the system.

The flashing parts described herein can be made in a number of ways, as the person of skill in the art will appreciate. For example, flashing parts can be made using coextrusion. With coextrusion, different sections of the tee can be made from different compositions. For example, the flange portions of the various parts could be made from a different material than the rest of the body. When the downwardly directed flanges from an upper part are made from a rubbery material, they can flexibly engage the PV module to provide a seal effect. In some embodiments, when the side flanges of the base piece are made from a flexible material they can accommodate fasteners and allow hard nailing while minimizing issues of buckling due to thermal expansion and contraction or movement of the roof, as the flexible material can dissipate or redirect the mechanical stresses. Coextrusion can also allow portions of the parts to have solar reflective properties to minimize heat distortion effects, as described in U.S. Pat. No. 7,846,548, which is hereby incorporated herein by reference in its entirety. For example the top exposed piece can be colored by an infrared-transparent visibly colored layer as a capping layer with an underlying inner layer that is solar reflective.

Plastic parts can provide more impact resistant performance for the tee or other framing pieces. The polymeric materials are resilient compared to metal parts, and will preferably not be subject to permanent deformations by hail, or other impacts, for example.

The two-part tee elements of the invention can result in a variety of advantages. For example, having two parts can allow for facile replacement of the exposed portion. This could be beneficial if a part in the field became damaged. It could also yield a changeable appearance for the photovoltaic roofing system for the building owner who would like to change the color by replacing tees or frame pieces with differently decorated accessories.

Figure 16:
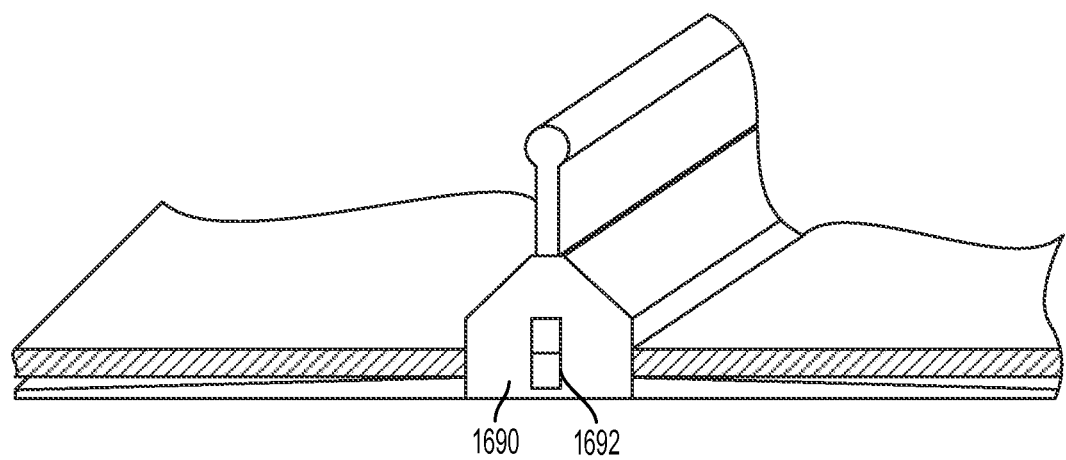
FIG. 16 is a perspective view of an assembly of components including an end cap according to one embodiment of the invention.

Thermal expansion effects can be addressed by the two-part tee elements described herein. In one instance, the base piece attachment feature of the top piece is slidably engaged with the top piece attachment feature of the base piece (which can be formed as one or more tracks or slots). The mechanical slot allows sliding of the parts as they expand or contract, leaving less chance for heat distortion for lineal sections of framing parts. In certain embodiments, an end cap is provided at the bottom end of the base piece on the roof. The end cap engages the base and closes the bottom end of the two-piece structure to moisture and other intrusions. It can also provide a mechanical stop and allows for free movement of the top piece so that in repeated lineal expansion and contraction, the top piece is retained by the base and does not migrate down the roof. The end cap can be attached by a mechanical fastener such as a nail or a screw or other mechanical fastener, or by an adhesive. An example of an end cap is shown in the partial perspective schematic view of FIG. 16. The embodiment of FIG. 16 is identical to that of FIG. 4B, but for the addition of the end cap 1690. In some cases, the cap provides a clip structure 1692 for retaining wiring or accessories for the array, or alternatively for attachment of decorative features to the roof, such as, for example, strings of Christmas lights, or the like. In one embodiment the end cap comprises a snow guard. In another embodiment, a set screw or other mechanical stop (see ref no 490 of FIG. 4B) serves to prevent downward movement of the top cover piece below a fixed point.

A variety of materials could be used for making the plastic framing parts, for example, PVC, ASA, AES, CPVC, or PP. In some cases, coextrusion is used to make the parts having a substrate layer for the bulk of the part and a capstock layer for exposed portions. The substrate layer is a bulk layer and can be produced from filler reinforced polymers. Examples of suitable polymers include polyethylene resin, ethylene-vinyl acetate copolymer resin, polypropylene resin, polystyrene resin, ASA resin, ABS resin, methacrylic resin, PVC resin, polyamide resin, polycarbonate resin, polyethylene terephthalate resin, polybutylene terephthalate resin, diallylphthalate resin, urea resin, melamine resin, xylene resin, phenol resin, unsaturated polyester resin, epoxy resin, furan resin, polybutadiene resin, polyurethane resin, melamine phenol resin, chlorinated polyethylene resin, vinylidene chloride resin, acrylic-vinyl chloride copolymer resin, polyacetal resin, polymethylpentene resin, polyphenylene oxide resin, denatured PPO resin, polyphenylene sulfide resin, butadiene styrene resin, polyamino bismaleimide resin, polysulfone resin, polybutylene resin, silicone resin, polyethylene tetrafluoride resin, polyethylene fluoride propylene resin, perfluoro alkoxy fluoride plastic, polyvinylidene fluoride resin, MBS resin, methacrylic-styrene resin, polyimide resin, polyallylate resin, polyallylsulfone resin, polyethersulfone resin, polyetheretherketone resin, chlorinated polyvinyl chloride resin, and the like. Particularly suitable polymers include PVC, CPVC, C-PE, co-PP, homo-PP, HDPE, UMWPE, LDPE, or combinations thereof. The composition can include a filler such as long or short glass fiber, natural mineral fiber, natural fibers, limestone or $CaCO_3$, talc, mica, wollastonite, wood fiber, wood flour, straw, kenaf, rice hulls, corn stalks, cork, or other fillers. The capstock layer can include polymers such as PMMA, PEMA, ASA, AES, ASA/PVC alloy, PVDF, ABS, polycarbonate, PVC, CPVC, PP, HDPE, UMWPE, LDPE, or other weatherable polymers. The capstock materials can contain additives such as one or more of UV blockers, UV stabilizers, antimicrobial agents, gloss reduction agents, thermal stabilizers and IR reflective pigments. In some embodiments, polymer or plastics for the substrate or capstock layer can be foamed using chemical blowing agent or physically blown with gas $CO_2$ or $N_2$ using microcellular foaming technology.

The parts described herein can also be formed from fiber reinforced plastics. For example, the parts could be made by pultrusion to produce a uniaxially fiber reinforced plastic lineal piece in either thermosetting or thermoplastic materials. Plastisol pultrusion methods are described in U.S. Patent Application Publication no. 2007/0126142 and U.S. Pat. No. 7,987,885, each of which is hereby incorporated herein by reference in its entirety.

In certain embodiments, flanges engaging photovoltaic elements are formed from ceramic (e.g., covering flanges of the top piece). Insertion of ceramic strips into a plastic base piece allows the use of a weatherable ceramic material that is stiff to hold a photovoltaic element down. In another alternative, the entire top piece can be made out of ceramic. The ceramic top strip could be decorated to fit the aesthetic of a ceramic tile roof for a photovoltaic roofing system that is made to complement a tile roof.

The two-part tee elements described herein can be attached to a roof deck through their base pieces, in any of a number of ways. As described above, fasteners can be used, for example in the central portion of the base piece. When the base piece includes a channel or a slot as part of the top piece attachment feature, mechanical fasteners can be installed the bottom of the base piece in the channel or slot to attach the base piece to a roof deck. A top piece can then be snapped into the slot after installation of a photovoltaic element adjacent the base piece. In this alternative, mechanical fasteners beneath the photovoltaic elements can be avoided. Of course, in alternative embodiments, the top piece can include the channel or slot, with the base piece having the feature which snaps into the channel or slot.

In another embodiment, the side flanges of the base piece include fabric nail hem as described for the attachment zone of siding panels in U.S. Pat. No. 5,857,303, which is hereby incorporated herein by reference in its entirety. This approach allows the use of staples as fasteners instead of nails. In some cases this yields less vertical protrusion of mechanical fasteners under photovoltaic elements than there may be with nail heads. In yet another alternative, the base piece is held in place on the roof surface by an adhesive.

The photovoltaic roofing system can be used in conjunction with a variety of types of roofing elements. For example, in one embodiment the roofing elements are bituminous shingles. In other embodiments, the roofing elements are formed from slate, tile, composite, polymer, or metal. Virtually any design of roofing element can be used in practicing the present invention. For example, any suitable shingle shape can be used, including standard three-tab shingles as well as architectural shingles of various thicknesses and designs. Various tile shapes, such as flat tiles. "S"-shaped tiles and wavy tiles can be used.

The photovoltaic elements can be, for example, flexible photovoltaic elements, such as the flexible photovoltaic laminates sold by United Solar Ovonic (Uni-Solar) under the product designation PVL (e.g., PVL-68). PVL-68 laminates include a lengthwise extending plurality of electrically-interconnected photovoltaic cells. Of course, other photovoltaic elements can be used. In certain embodiments, the photovoltaic elements can be wider, for example with an array having more than one cell along the width of the laminate, and a plurality of cells extending along the length of the laminate. In one embodiment, the photovoltaic elements are flexible photovoltaic elements that have a generally strip-like shape (e.g., widths in the range of 0.3 m-0.7 m, and lengths of greater than 1 m), with the strips being oriented so that they run in a direction from the top edge of the photovoltaic area to the bottom edge of the photovoltaic area. In certain embodiments, the photovoltaic elements have at least one dimension greater than 1 m. For example, the photovoltaic element can have at least one dimension greater than 1 m, and another dimension greater than 0.5 m, 0.7 m, or even 1 m. Wider laminates can reduce application time and reduce the number of standing seam flashings in the final system.

The photovoltaic elements can, in certain embodiments, have an adhesive layer on their bottom surfaces (for example, accessible by removing a removable release liner). The adhesive can adhere to the top surface of the roof deck (e.g., directly to the wood of the deck or to an underlayment layer). One example of a possible underlayment material is an ice and water shield (e.g., a modified bituminous material such as WinterGuard® HT available from CertainTeed Corporation). Alternatively, a separate layer of a material can be disposed on the roof deck in the photovoltaic area, and the adhesive layer can adhere to the material. The material can be, for example, a roofing membrane (e.g., formed from thermoplastic polyolefin (TPO), PVC, EPDM, a bituminous material, or a modified bituminous material, e.g., WinterGuard® HT available from CertainTeed Corp.), or an underlayment material (e.g., synthetic underlayments, saturated underlayments). Moreover, the adhesive material can adhere to the flanges of flashing (both the side flashing and any flashing disposed between contiguously-disposed photovoltaic elements in the photovoltaic area. In some embodiments, it may be desirable to use an adhesion promoter to improve adhesion between any adhesive or sealant to the photovoltaic elements.

Another aspect of the invention is a kit for the installation of a photovoltaic roofing system as described herein. The kit includes a plurality of base pieces as described herein; a plurality of top pieces as described herein. In another embodiment, the kit includes a plurality of photovoltaic elements as described herein.

It will be apparent to those skilled in the art that various modifications and variations can be made to the present invention without departing from the scope of the invention. Thus, it is intended that the present invention cover the modifications and variations of this invention provided they come within the scope of the appended claims and their equivalents.

What is claimed is:

1. A photovoltaic roofing system disposed on a roof deck, the photovoltaic roofing system comprising:
   a two-part tee element disposed on the roof deck, the two-part tee element comprising:
      a base piece including a central portion, the central portion including a channel having a bottom surface; two opposed horizontally-extending first and second flanges extending from the central portion, and a top piece attachment feature formed in the central portion, and a top piece including a base piece attachment feature mated with the top piece attachment feature of the base piece; a first covering flange extending outwardly from a side of the top piece, and a vertically extending portion extending upwards from the base piece attachment feature and the first covering flange;

one or more fasteners disposed in the channel and driven through the bottom surface of the channel to fasten the base piece of the two part tee element to the roof deck; and a first photovoltaic element disposed on the roof adjacent the base piece, the first photovoltaic element having its edge disposed on the horizontally-extending first flange of the base piece of the two-part tee element, the first covering flange of the top piece overlapping the top surface of the first photovoltaic element.

2. The photovoltaic roofing system according to claim 1, wherein the first photovoltaic element overlaps the first flange by at least about one inch.

3. The photovoltaic roofing system according to claim 1, further including a second photovoltaic element disposed on the roof adjacent the base piece opposite the first photovoltaic element, the second photovoltaic element having its edge disposed on the horizontally-extending second flange of the base piece of the two-part tee element.

4. The photovoltaic roofing system according to claim 3, wherein the second photovoltaic element overlaps the first flange by at least about one inch.

5. The photovoltaic roofing system according to claim 1, further including a roofing element disposed on the roof adjacent the base piece opposite the first photovoltaic element, the roofing element having its edge disposed on the horizontally-extending second flange of the base piece of the two-part tee element.

6. The photovoltaic roofing system according to claim 5, wherein the roofing element overlaps the first flange by at least about one inch.

7. The photovoltaic roofing system according to claim 1, further comprising a second covering flange extending outwardly from the opposite side of the top piece, and overlapping the top surface of a second photovoltaic element or a roofing element disposed on the roof adjacent the base piece, the first photovoltaic element or the roofing element having its edge disposed on the horizontally-extending first flange of the base piece of the two-part tee element.

8. The photovoltaic roofing system according to claim 1, wherein the material of the central portion of the base piece has a different material composition than do the materials of the first and second flanges.

9. The photovoltaic roofing system according to claim 8, wherein the first and second flanges are formed from a different material than is the base piece, and wherein the materials of the first and second flanges are softer than the material of the central portion of the base piece.

10. The photovoltaic roofing system according to claim 1, wherein the top piece of the two-part tee is formed from a different material than the base piece.

11. The photovoltaic roofing system according to claim 1, wherein when the base piece attachment feature of the top piece is mated with the top piece attachment feature of the base piece, the base piece attachment feature of the top piece is slidably engaged with the top piece attachment feature of the base piece, such that the top piece can slide with respect to the base piece along the axis of the base piece.

12. The photovoltaic roofing system according to claim 11, further comprising an end cap disposed at the bottom end of the base piece on the roof, the end cap engaging the base and closing the bottom end of the two-piece tee element.

13. A method for installing a photovoltaic roofing system according to claim 1 on a roof, the method comprising:

affixing a plurality of base pieces to a roof, each base piece including a central portion, the central portion including a channel having a bottom surface; two opposed horizontally-extending first and second flanges extending from the central portion, and a top piece attachment feature formed in the central portion;

disposing one or more photovoltaic elements on the roof, each between two base pieces, such that each horizontal edge of each of the photovoltaic elements is disposed on a flange of one of the base pieces; and assembling a top piece with each base piece to form the two-part tee elements, each top piece including a base piece attachment feature mated with the top piece attachment feature of the base piece, a first covering flange extending outwardly from a side of the top piece, a second covering flange extending outwardly from an opposite side of the top piece, and a vertically extending portion extending upwards from the base piece attachment feature and the first and second covering flanges, with each covering flange overlapping the top surface of one of the photovoltaic elements.

14. A kit for the installation of a photovoltaic roofing system according to claim 1, the kit comprising a plurality of base pieces, each including a central portion, the central portion including a channel having a bottom surface; two opposed horizontally-extending first and second flanges extending from the central portion, and a top piece attachment feature formed in the central portion, and a plurality of top pieces, each including a base piece attachment feature matable with the top piece attachment feature of the base piece; a first covering flange extending outwardly from a side of the top piece, and a vertically extending portion extending upwards from the base piece attachment feature and the first covering flange.

15. The kit according to claim 14, further comprising a plurality of photovoltaic elements.

16. The photovoltaic roofing system according to claim 1, wherein the first covering flange of the top piece is formed from a different material than the central portion of the top piece, and wherein the first covering flange is formed from a rubbery or flexible material.

17. The photovoltaic roofing system according to claim 1, wherein the first covering flange of the top piece is formed from a different material than the central portion of the top piece, and wherein the first covering flange is formed from stiffer material than the central portion of the top piece.

18. The photovoltaic roofing system according to claim 1, wherein the first photovoltaic element is a flexible photovoltaic laminate.

* * * * *